United States Patent [19]

Gritton

[11] Patent Number: 4,467,441
[45] Date of Patent: Aug. 21, 1984

[54] ADAPTIVE FILTER INCLUDING CONTROLLED TAP COEFFICIENT LEAKAGE

[75] Inventor: Charles W. K. Gritton, North Brunswick, N.J.

[73] Assignee: AT&T Bell Laboratories, Murray Hill, N.J.

[21] Appl. No.: 433,409

[22] Filed: Oct. 8, 1982

[51] Int. Cl.³ .............................................. G06F 15/31
[52] U.S. Cl. ..................................... 364/724; 375/14; 333/18
[58] Field of Search ......................... 364/724; 375/14; 333/18, 166

[56] References Cited

U.S. PATENT DOCUMENTS

| 4,237,554 | 12/1980 | Gitlin et al. | 375/15 |
| 4,243,959 | 1/1981 | Duttweiler | 333/166 |
| 4,376,308 | 3/1983 | McNair | 375/14 |
| 4,384,355 | 5/1983 | Werner | 375/14 |

OTHER PUBLICATIONS

"Fractional Tap-Spacing Equalizer and Consequences for Clock Recovery in Data Modems", *IEEE Transactions on Communications*, by Gottfried Ungerboeck, vol., COM-24, No. 8, pp. 856-864, Aug. 1976.

*Primary Examiner*—David H. Malzahn
*Attorney, Agent, or Firm*—Thomas Stafford

[57] ABSTRACT

In adaptive filters, under certain incoming signal conditions the tap coefficients tend to drift toward relatively large values. This condition has been countered by introducing so-called leakage into the tap coefficients which tends to drive them toward zero. Introduction of leakage is desirable under certain incoming signal conditions and not others. Indeed, during intervals that partial band energy, e.g., single frequency tones, multi-frequency tones and the like, is incoming to the filter there is a need to introduce a relatively large leakage value into the tap coefficients. However, during intervals that whole band energy, e.g., speech or noise, is incoming to the filter no leak is desired or needed. This is realized by detecting intervals when partial band energy is incoming to the filter and controllably increasing the leakage value during those intervals.

10 Claims, 5 Drawing Figures

ADAPTIVE FILTER INCLUDING CONTROLLED TAP COEFFICIENT LEAKAGE

TECHNICAL FIELD

This invention relates to adaptive filters and, more particularly, to controlling tap coefficient leakage during prescribed incoming signal conditions.

BACKGROUND OF THE INVENTION

Adaptive filters operate on an incoming signal in accordance with a prescribed algorithm to generate a desired output signal. Typically, the filters generate an impulse response in accordance with the algorithm which includes adjustment of so-called tap coefficients to update the impulse response in response to an error signal. In this way the filter impulse response is optimized to yield the desired result.

During certain incoming signal conditions, for example, partial band energy including single frequency tones, multifrequency tones and the like, the tap coefficients tend to drift toward relatively large values, which is undesirable. This condition has been countered by introducing a so-called leakage signal into the tap coefficient signals which tends to drive the tap coefficient signals toward zero. Prior tap coefficient leakage arrangements are disclosed in U.S. Pat. Nos. 4,237,554 issued Dec. 2, 1980 and 4,243,959 issued Jan. 6, 1981.

Both of the prior arrangements, however, introduce leakage at substantially a constant rate during all incoming signal conditions. Specifically, the arrangement disclosed in U.S. Pat. No. 4,243,959 introduces a so-called "weak" leakage by periodically or intermittently switching the supply of a leakage signal to the tap coefficient signals.

I have determined that in the prior arrangements the value of the leakage signal supplied to the tap coefficients is a compromise in order to minimize deleterious effects during intervals including other than partial band energy in the incoming signal. It has been determined that a relatively large leakage is needed during intervals when partial band energy is incoming to the filter and relatively small or no leakage is needed during intervals when whole band energy, for example, speech, noise and the like, is incoming to the filter.

SUMMARY OF THE INVENTION

The problems or prior adaptive filter tap coefficient leakage introduction arrangements are overcome, in accordance with an aspect of the invention, by controllably adjusting the leakage magnitude value during prescribed filter incoming signal conditions. More specifically, intervals are detected during which the filter incoming signal includes partial band energy and the leakage magnitude value introduced into the tap coefficient signals is controllably increased during those intervals.

BRIEF DESCRIPTION OF THE DRAWING

The invention will be more fully understood from the following detailed description of illustrative embodiments taken in connection with the appended figures in which.

DETAILED DESCRIPTION

Figure 1:
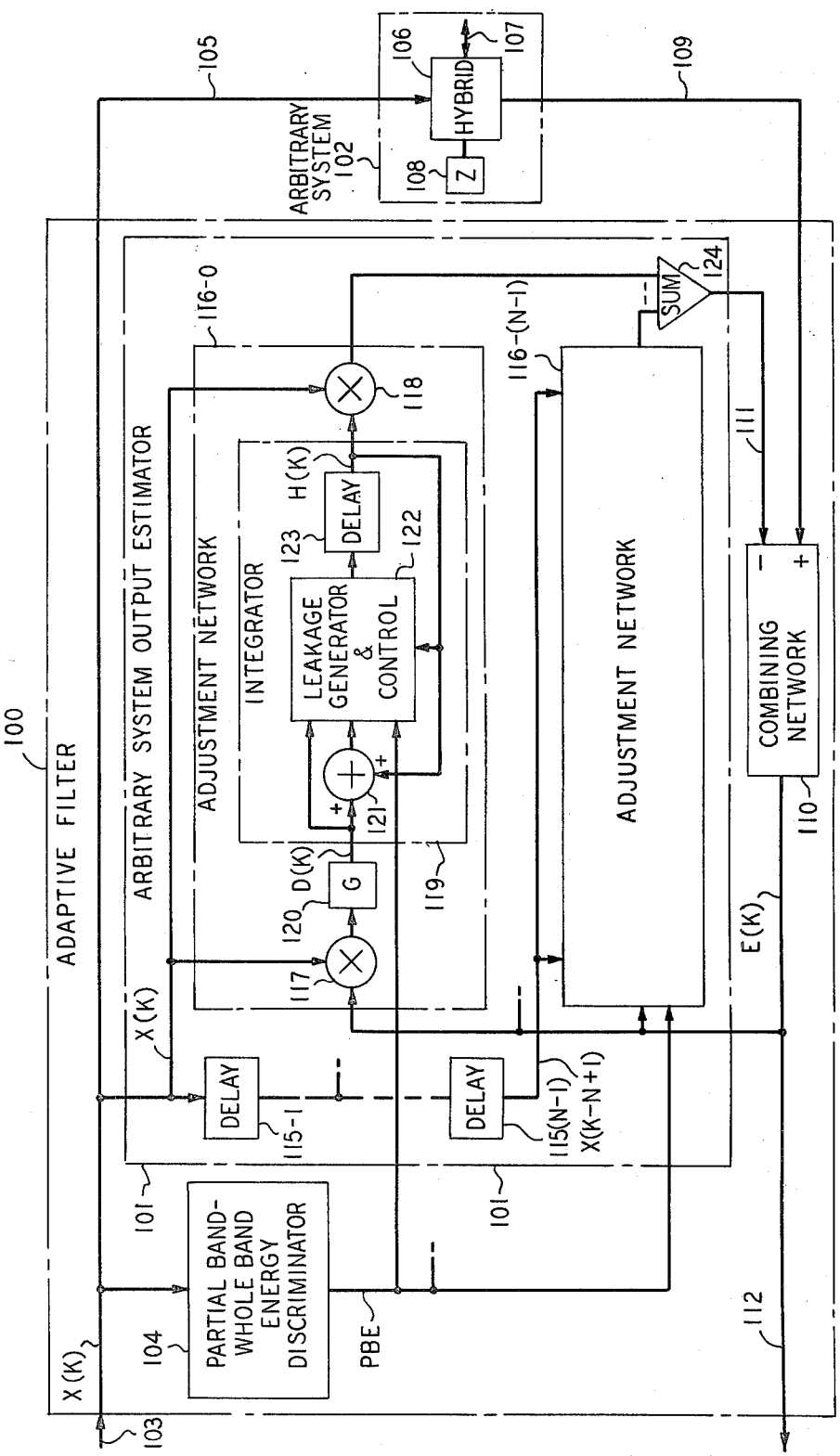
FIG. 1 shows in simplified block diagram form an adaptive filter including an embodiment of the invention.

Adaptive filter 100 including an embodiment of the invention is shown in simplified block diagram form in FIG. 1. Adaptive filter 100 is similar to the adaptive filter used in echo cancelers disclosed in U.S. Pat. Nos. 3,499,999 and 3,500,000. Briefly, adaptive filter 100 includes an adjustable signal processor having a closed loop error control system which is self-adapting in that it automatically tracks signal variation in an outgoing path. More specifically, filter 100 employs arbitrary system output estimator 101 including an adaptive transversal filter arrangement for synthesizing a linear approximation of arbitrary system 102. To this end, far end incoming signal X(K) is usually supplied from a far end signal source over a first transmission path, e.g., lead 103, to a first input of filter 100 and, therein, to an input of partial band-whole band energy discriminator 104 and to an input of arbitrary system output estimator 101. Discriminator 104 preferably is of a type described in my copending application, Ser. No. 240,978, filed Mar. 5, 1981 now U.S. Pat. No. 4,426,729 issued on Jan. 17, 1984. For another discriminator arrangement see copending application Ser. No. 240,977, filed Mar. 5, 1981. Far end signal X(K) may be, for example, a digitally sampled speech signal, where K is an integer indentifying the sampling interval. A typical sampling rate is 8 kHz used in PCM transmission. Far end signal X(K) is also supplied via lead 105, perhaps through some conversion circuitry, e.g., a digital-to-analog converter not shown, to arbitrary system 102. In an echo canceler application, arbitrary system 102 includes hybrid 106, matching impedance 108 and bidirectional transmission path 107. It is usually desirable for the input signal to hybrid 106 from lead 105 to be supplied over bidirectional path 107 to a near-end listening party. However, because of an impedance mismatch in hybrid 106, typically caused by balance impedance 108 not exactly matching the impedance of bidirectional path 107, a portion of the hybrid input signal appears on outgoing lead 109 and is reflected to the far end signal source as an echo signal. Similarly, any arbitrary system 102 will generate a system output signal which differs from that generated by estimator 101 until adaptive filter 100 converges to the arbitrary system characteristic. The output of arbitrary system 102 is, therefore, equivalent to the echo signal in an echo canceler application. The output signal of arbitrary system 102 is supplied over lead 109 to another input of filter 100 and therein to a first input of combining network 110. Lead 109 may also include conversion apparatus, e.g., an analog-to-digital converter not shown. A second input to combining network 110 is a signal estimate of the arbitrary system output signal generated by estimator 101. The arbitrary system output estimate is supplied via lead 111 from an output of estimator 101 to the second input of combining network 110. Combining network 110 generates error signal E(K) corresponding to the algebraic difference between the arbitrary system output estimate from estimator 101 and the output from arbitrary system 102. Error signal E(K) is supplied over a second transmission path, e.g., lead 112 to the far end source and to estimator 101.

Estimator 101 includes a so-called tapped delay line comprised of delay units 115-1 through 115-(N−1) (a shift register) for realizing desired delays at the taps corresponding to convenient Nyquist intervals. Therefore, delayed replicas X(K−1) through X(K−N+1) of incoming far end signal X(K) are generated at the corresponding taps. The signal at each tap position, namely X(K−1) through X(K−N+1) as well as X(K), is adjusted in response to error signal E(K). More particularly, signals X(K) through X(K−N+1) are individually weighted in response to E(K) via a corresponding one of adjustment networks 116-0 through 116-(N−1), respectively. Adjustment networks 116-0 through 116-(N−1) each include multipliers 117 and 118, integrator 119 and gain unit 120. Gain unit 120 is employed to adjust update gain as described in my copending application Ser. No. 393,124, filed June 28, 1982. Integrator 119 adjusts the tap coefficient weight to a desired value. To this end, integrator 119 includes summer 121, leakage generator and control 122, which is responsive to signal PBE from discriminator 104 for controllably introducing a relatively large leakage into the tap coefficient signal, in accordance with an aspect of the invention, during intervals that partial band energy is incoming to filter 100, and delay 123. Discriminator 104 generates partial band energy signal PBE, in this example, representative of a logical 1 when so-called partial band energy is incoming to filter 100. Again, see my copending application, Ser. No. 240,978 now U.S. Pat. No. 4,426,729 noted above. Signal PBE is supplied to each of adjustment networks 116 and therein to integrator 119. Outputs from adjustment networks 116 are weighted replicas of X(K) and are summed via summing networks 124 to generate the arbitrary system output or echo estimate signal approximating the output from arbitrary system 102 for the echo to be canceled. The arbitrary system estimate is supplied via lead 111 to a second input of combining network 110.

Briefly, integrator 119 operates to generate tap coefficient signal H(K). To this end, signal D(K) from gain unit 120 is an updating component which is, for example, a correlated signal generated by a delayed replica of input signal X(K) (for adjustment network 116-0 the delay is zero) being multiplied with error signal E(K) via multiplier 117 and adjusting its value by gain G. Update component D(K) is supplied to summer 121 and to leakage generator and control 122. Also supplied to summer 121 is tap coefficient signal H(K) from delay 123. The output of summer 121 is an updated version of the tap coefficient signal and is supplied to leakage generator and control 122. Output PBE from partial band-whole band energy discriminator 104 is also supplied to leakage generator and control 122 as is tap coefficient signal H(K). Leakage generator and control 122 is responsive to signals D(K) and H(K), and under control of signal PBE controllably introduces leakage signal L(K) having an increased value into the updated tap coefficient signal during intervals that partial band energy is detected in the incoming signal X(K) in accordance with an aspect of the invention.

Figure 2:
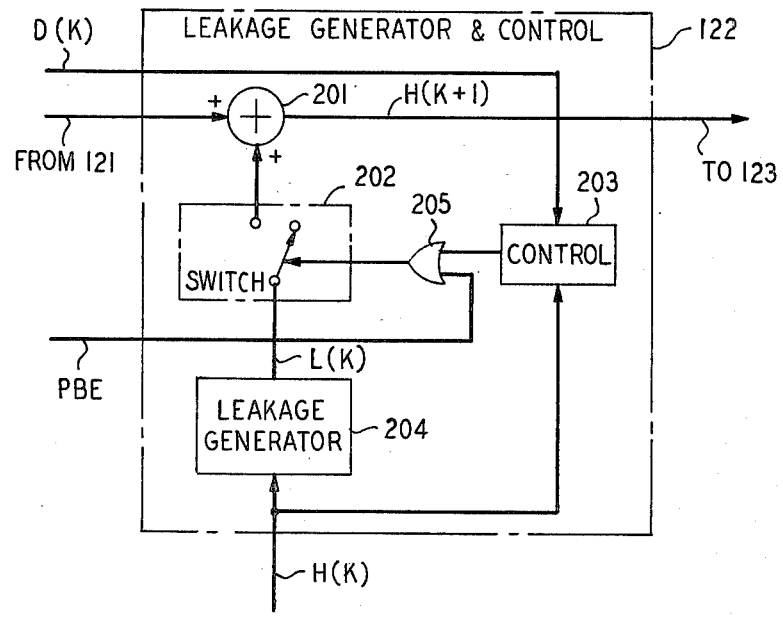
FIG. 2 depicts in simplified block diagram form one embodiment of the leakage generator and control of FIG. 1.

FIG. 2 shows in simplified block diagram form a functional diagram of an embodiment of leakage generator and control 122, in accordance with an aspect of the invention. Accordingly, shown is summer 201 to which are supplied the updated tap coefficient signal from summer 121, namely, D(K)+H(K), and leakage signal L(K) via controllable switch 202. Updating component D(K) is supplied to control 203 while tap coefficient signal H(K) is supplied to leakage generator 204 and to control 203. Partial band energy signal PBE is supplied to one input of OR gate 205 while an output from control 203 is supplied to a second input of OR gate 205. An output from OR gate 205 is supplied to control operation of switch 202. Leakage generator and control 122 except for the addition of OR gate 205 and signal PBE is essentially identical to that described in U.S. Pat. No. 4,243,959 noted above. In that arrangement a so-called "weak" leakage signal [L(K)] is introduced by control 203 controlling switch 202 to supply leakage signal L(K) generated from leakage generator 204 to summer 201 at a periodic rate, for example, for one out of 64 consecutive sample intervals. Additionally, control 203 is responsive to signals D(K) and H(K) to further control the strength of leakage signal L(K). Specifically, switch 202 is further controlled to supply leakage signal L(K) to summer 201 only when updating component signal D(K) and tap coefficient signal H(K) are of opposite algebraic signs. Leakage generator 204 responds to tap coefficient signal H(K) to generate a positive leakage signal or a negative leakage signal when H(K) is negative or positive, respectively. Again, see U.S. Pat. No. 4,243,959 noted above. OR gate 205 is operative in response to partial band energy signal PBE, in accordance with an aspect of the invention, to control switch 202 for supplying leakage signal L(K) from generator 204 to summer 201 continuously during intervals that partial band energy is present in incoming signal X(K). In this manner, the average magnitude value of leakage signal L(K) introduced into the tap coefficient signal is significantly increased, in accordance with an aspect of the invention, during intervals that partial band energy is incoming to the filter.

Leakage generator 204 is operative to generate leakage signal $L(K) = \alpha$ sign $[H(K)]$ where $\alpha$ is the tap leakage component. In this example, $\alpha$ is a predetermined constant, and sign $[H(K)]$ is either $+1$ or $-1$ corresponding to the algebraic sign of H(K). Assuming by way of example, that $\alpha = -1$, then the tap coefficient signal is driven slightly toward zero during each sample interval K that L(K) is supplied to summer 201. A positive "nudge" toward zero is obtained for negative valued coefficients while a negative nudge toward zero is obtained for positive valued coefficients. Thus, it is seen that the updated tap coefficient $H(K+1)$ is $$H(K+1) = H(K) + D(K) + L(K) \quad (1)$$

Figure 3:
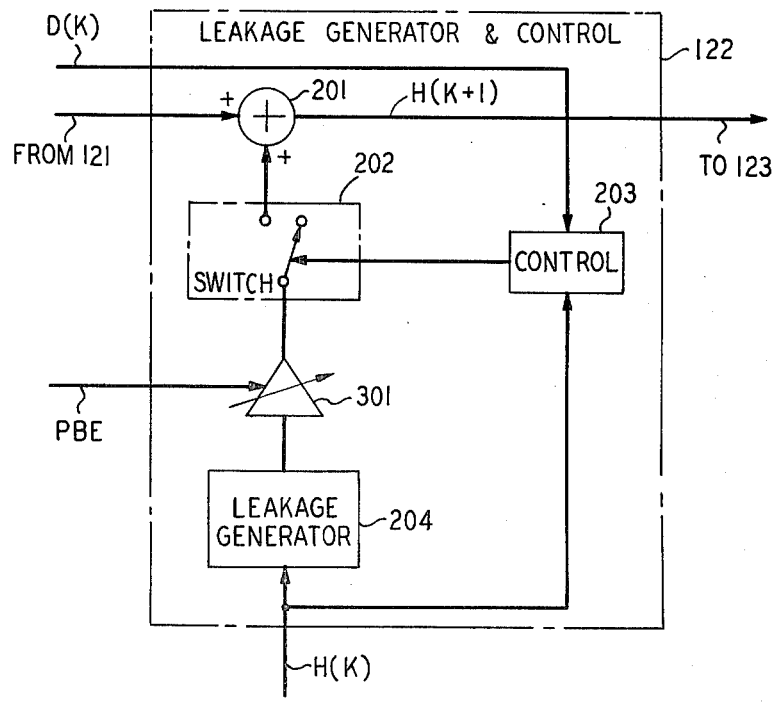
FIG. 3 shows in simplified block diagram form details of another embodiment of the leakage generator and control of FIG. 1.

FIG. 3 depicts in simplified block diagram form another embodiment of leakage generator and control 122. Leakage generator and control 122 shown in FIG. 3 is similar to that shown in FIG. 2. Accordingly, elements which have the same function as those in FIG. 2 have been similarly numbered and will not be described again. The difference between the embodiments of FIG. 2 and FIG. 3 is that the embodiment shown in FIG. 3 does not include OR gate 205 but instead leakage generator and control 122 includes controllable gain unit 301 for generating $L(K) = \alpha$ sign $[H(K)]$. To this end, gain unit 301 is responsive to partial band energy signal PBE to adjust the value of $\alpha$ and, hence, leakage signal L(K). Specifically, gain unit 301 responds to a logical 1 PBE signal to increase the value of α by a predetermined value during intervals that partial band energy is included in the filter incoming signal. In one example, α is increased from $2^{-18}$ to $2^{-17}$.

Figure 4:
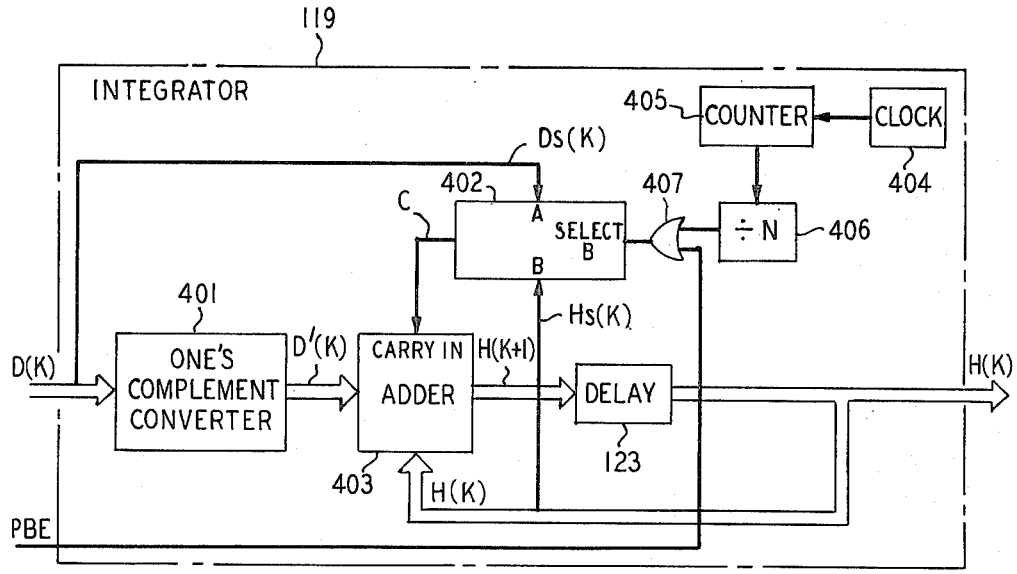
FIG. 4 depicts in simplified form details of one embodiment of the integrator of FIG. 1.

FIG. 4 shows in simplified block diagram form details of integrator 119 of FIG. 1 including one embodiment of the invention. Accordingly, updating component D(K) is supplied in two's complement form to one's complement converter 401. The sign bit Ds(K) of D(K) is supplied to input A of selector 402. As is known, one's complement binary form is identical to two's complement binary form except that the one's complement form of a negative number is one less than its two's complement form. Thus, one's complement converter 401 generates one's complement version D'(K) of updating component D(K). Signal D'(K) is supplied to a first summing input of adder 403 while tap coefficient signal H(K) is supplied to a second summing input and sign bit Hs(K) of H(K) is supplied to input B of selector 402. Signal C is supplied from selector 402 to a so-called carry in input of adder 403. Adder 403 is operative to generate $$H(K+1) = H(K) + D'(K) + C \quad (2).$$

H(K+1) is in two's complement form and is supplied to delay 123 to generate H(K), the desired tap coefficient modified by leakage signal L(K). Clock 404, counter 405 and divider 406 are employed to generate a periodic enable signal, for example, at a one out of 64 rate which is supplied via a first input of OR gate 407 to a select B input of selector 402. Clock 404 generates a 8 kHz clock signal. Partial band energy signal PBE is supplied to a second input of OR gate 407 and, hence, to the select B input of selector 402. Again, signal PBE controls selector 402 to select the B input continuously during intervals that partial band energy incoming to the filter, thereby controllably increasing the value of leakage introduced into the tap coefficient signal, in accordance with an aspect of the invention, as will become apparent from the following discussion.

Integrator 119 operates to generate the desired updated tap coefficient $$H(K+1) = H(K) + D(K) + L(K) \quad (3).$$

Briefly, it is noted that H(K) and D(K) both assume positive and negative values and, since, both H(K) and D(K) are represented in binary form, two's complement form is the most convenient for adding H(K) and D(K) to generate H(K+1). As indicated above, the one's complement form of D(K), namely, D'(K) is the same as the two's complement form when Ds(K) is positive but one less than the two's complement form when Ds(K) is negative. Operation of adder 403 when selector 402 is supplying input A, i.e., Ds(K) via C to the carry in input, is to add one to D'(K) when Ds(K) is negative and to add zero when Ds(K) is positive thereby obtaining the appropriate two's complement form of D(K). Leakage is obtained by selector 402 supplying Hs(K) via C to the carry in input of adder 403. Again, it is important to remember that D'(K) is one less, i.e., $D'(K) = D(K) - 1$, when Ds(K) is negative (Ds(K)=1) and $D'(K) = D(K)$, when D(K) is positive (Ds(K)=0). Then, letting H without (K+1) equal the two's complement addition of D(K) and H(K) without leakage, the introduce of leakage when D(K) and H(K) are of opposite algebraic signs is apparent from the following table.

| D(K) | H(K) | Ds(K) | Hs(K) | H(K+1) |
|---|---|---|---|---|
| >0 | >0 | 0 | 0 | H without (K+1) |
| <0 | >0 | 1 | 0 | H without (K+1)−1 |
| >0 | <0 | 0 | 1 | H without (K+1)+1 |
| <0 | <0 | 1 | 1 | H without (K+1) |

Therefore, when Ds(K)=Hs(K) no leakage is added and when Ds(K)≠Hs(K) a leakage of one (1) is added or subtracted, i.e., when H(K) is positive a negative leakage is introduced and when H(K) is negative a positive leakage is introduced.

Clock 404, counter 405 and divider 406 further operate to control introduction of leakage at a fixed rate. As indicated above, signal PBE being a logical 1, thereby indicating partial band energy incoming to the filter, controls selector 402 via OR gate 407 to supply Hs(K) continuously to adder 402 and, hence, increasing the effective value of leakage introduced, in accordance with an aspect of the invention.

Figure 5:
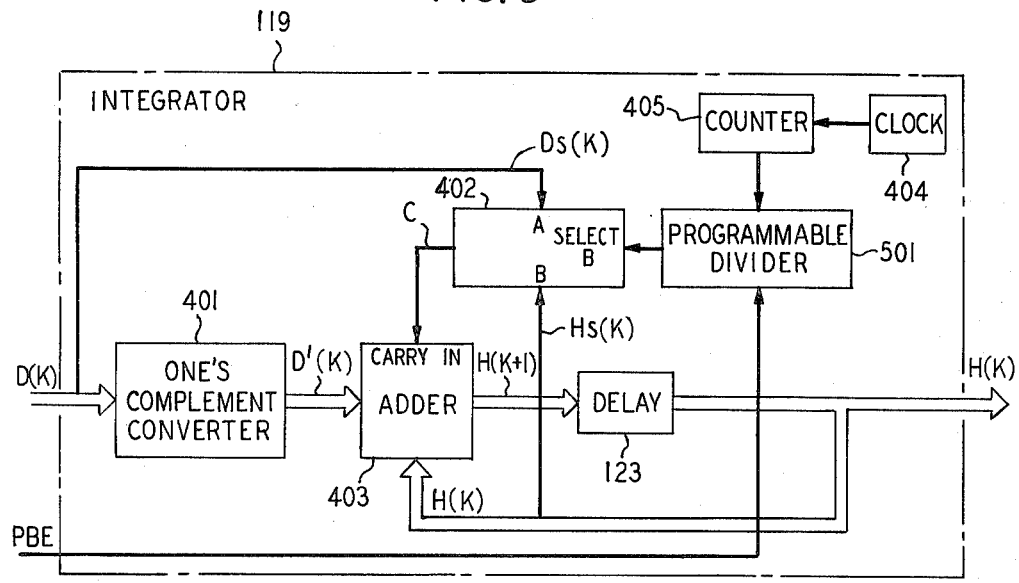
FIG. 5 shows in simplified form details of another embodiment of the integrator of FIG. 1.

FIG. 5 depicts in simplified block diagram form details of another embodiment of integrator 119 including the invention. Integrator 119 shown in FIG. 5 is similar to that shown in FIG. 4. Accordingly, elements which have the same function as those in FIG. 4 have been similarly numbered and will not be described again. The difference between the embodiments of FIG. 4 and FIG. 5 is that the embodiment of FIG. 5 does not include OR gate 407 and divider 406. Included, however, is programmable divider 501 which is responsive to partail band energy signal PBE to control the value of leakage introduced. For example, programmable counter 501 can be set to supply a periodic signal to the select B input of selector 402 for controlling the introduction of leakage as described above in relation to FIG. 4, at a first prescribed ratio of sampling intervals during intervals when PBE equals a logical 0 and no partial band energy is incoming, and at a second prescribed ratio of sampling intervals during intervals when PBE equals a logical 1 and partial band energy is incoming. In one example, introduction of leakage is enabled every fourth sampling interval when PBE=0 and every other sampling interval when PBE=1, thereby significantly increasing the leakage value introduced, in accordance with an aspect of the invention, when partial band energy is incoming.

The above arrangements are only examples of embodiments of the invention and it will be apparent to those skilled in the art that various changes in form and detail may be made without departing from the spirit and scope of the invention. The embodiments of the invention described operate to detect partial band energy incoming to the filter and to increase the value of leakage introduced to the tap coefficients. It would be equally applicable to set the leakage value at a desired increased value and reduce the leakage during intervals when the filter incoming signal includes other than patial band energy, for example, during intervals that whole band energy is incoming to the filter.

What is claimed is:

1. An adaptive filter including,
   means for detecting prescribed filter incoming signal conditions,
   a plurality of means each for generating a corresponding one of a plurality of tap coefficient signals, each of said tap coefficient signal generating means including means for generating a leakage signal having a magnitude, means for combining the leakage signal with said corresponding one of said tap coefficient signals, and means responsive to a signal from said detecting means for controllably adjusting the leakage signal magnitude during said prescribed filter incoming signal conditions.

2. The invention as defined in claim 1 wherein said adjusting means includes means for increasing the leakage signal magnitude during the prescribed filter incoming signal conditions.

3. The invention as defined in claim 1 wherein said prescribed filter incoming signal conditions include partial band energy incoming to the filter.

4. An adaptive filter including, means for detecting intervals of prescribed filter incoming signal conditions, a plurality of means each for generating a corresponding one of a plurality of tap coefficient signals, each of said tap coefficient signal generating means including means for generating a leakage signal having a magnitude, means for combining the leakage signal with said corresponding one of said tap coefficient signals, and means responsive to a signal from said detecting means indicative of said intervals of prescribed filter incoming signal conditions for controllably adjusting the leakage signal magnitude.

5. The invention as defined in claim 4 wherein said detecting means includes means for detecting partial band energy incoming to the filter.

6. The invention as defined in claim 4 wherein said adjusting means includes means for increasing the leakage signal magnitude in response to said detecting means signal.

7. The invention as defined in claim 4 wherein said leakage signal generating means includes means for controllably supplying said leakage signal to said combining means, and wherein said adjusting means includes means responsive to said detecting means signal for controlling said supplying means to continuously supply said leakage signal during intervals that partial band energy is incoming to the filter.

8. The invention as defined in claim 4 wherein said leakage signal generating means includes means responsive to said detecting means signal for controllably supplying said leakage signal to said combining means.

9. The invention as defined in claim 8 wherein said supplying means includes means responsive to said detecting means signal for controlling the rate at which the leakage signal is supplied to said combining means.

10. The invention as defined in claim 9 wherein said detecting means signal is indicative of partial band energy incoming to the filter and said rate control means is responsive to the detecting means signal to increase the rate of supply of the leakage signal.

* * * * *